United States Patent
Aisenbrey

(10) Patent No.: US 8,268,222 B2
(45) Date of Patent: Sep. 18, 2012

(54) METHODS OF MAKING ELECTRICAL MOTOR COMPONENTS FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 1226 days.

(21) Appl. No.: 11/127,578

(22) Filed: May 12, 2005

(65) Prior Publication Data

US 2005/0204544 A1 Sep. 22, 2005

Related U.S. Application Data

(63) Continuation-in-part of application No. 10/877,092, filed on Jun. 25, 2004, now abandoned, which is a continuation of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/317,808, filed on Sep. 7, 2001, provisional application No. 60/269,414, filed on Feb. 16, 2001, provisional application No. 60/268,822, filed on Feb. 15, 2001, provisional application No. 60/570,632, filed on May 13, 2004.

(51) Int. Cl.
*B29C 45/00* (2006.01)
*B29C 70/58* (2006.01)

(52) U.S. Cl. .......... 264/328.1; 264/328.18; 264/131

(58) Field of Classification Search ............... None
See application file for complete search history.

(56) References Cited

U.S. PATENT DOCUMENTS 2,020,085 A * 11/1935 Smith et al. .......... 252/511
(Continued)

FOREIGN PATENT DOCUMENTS

DE 4227208 2/1994
(Continued)

OTHER PUBLICATIONS

Co-pending U.S. Patent INT-04-010A, "Low Cost Electrical Motor Components Manufactured From Conductive Loaded Resin-Based Materials," U.S. Appl. No. 11/127,574, filed May 12, 2005, assigned to the same assignee as the present invention.
(Continued)

*Primary Examiner* — Edmund H. Lee
(74) *Attorney, Agent, or Firm* — Matthew P. Frederick; Carl H. Pierce; Reed Smith LLP

(57) ABSTRACT

Electric motor components are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are metals or conductive non-metals or metal plated non-metals. The micron conductive fibers may be metal fiber or metal plated fiber. Further, the metal plated fiber may be formed by plating metal onto a metal fiber or by plating metal onto a non-metal fiber. Any platable fiber may be used as the core for a non-metal fiber. Superconductor metals may also be used as micron conductive fibers and/or as metal plating onto fibers in the present invention.

24 Claims, 4 Drawing Sheets

U.S. PATENT DOCUMENTS

| | | | | |
|---|---|---|---|---|
| 2,252,277 | A | * | 8/1941 | Tate et al. .................. 252/503 |
| 2,416,480 | A | * | 2/1947 | Henry et al. ................ 252/511 |
| 4,189,702 | A | * | 2/1980 | Maloy ......................... 367/109 |
| 4,303,844 | A | * | 12/1981 | Suzuki ..................... 310/154.05 |
| 4,572,979 | A | * | 2/1986 | Haar et al. ................ 310/68 R |
| 5,144,181 | A | * | 9/1992 | Shibuya ...................... 310/251 |
| 5,771,027 | A | | 6/1998 | Marks |
| 5,951,918 | A | | 9/1999 | Kuwajima |
| 6,147,662 | A | | 11/2000 | Grabau |
| 6,249,261 | B1 | | 6/2001 | Solberg, Jr. |
| 6,356,234 | B1 | | 3/2002 | Harrison |
| 2002/0148100 | A1 | * | 10/2002 | Du ................................ 29/597 |
| 2003/0010958 | A1 | * | 1/2003 | Hareyama et al. ........... 252/500 |

FOREIGN PATENT DOCUMENTS

| | | |
|---|---|---|
| EP | 0862240 | 9/1998 |
| EP | 1024552 | 1/2000 |
| EP | 1233426 | 8/2002 |
| GB | 2377449 | 7/2001 |
| JP | 06188629 | 12/1994 |
| JP | 07162220 | 6/1995 |
| WO | WO 92/10352 * | 6/1992 |

OTHER PUBLICATIONS

U.S. Patent App. US 2002/0148100 A1 to Du, Pub. Date Oct. 17, 2002, filed Jun. 10, 2002, US Cl 29/597.

* cited by examiner

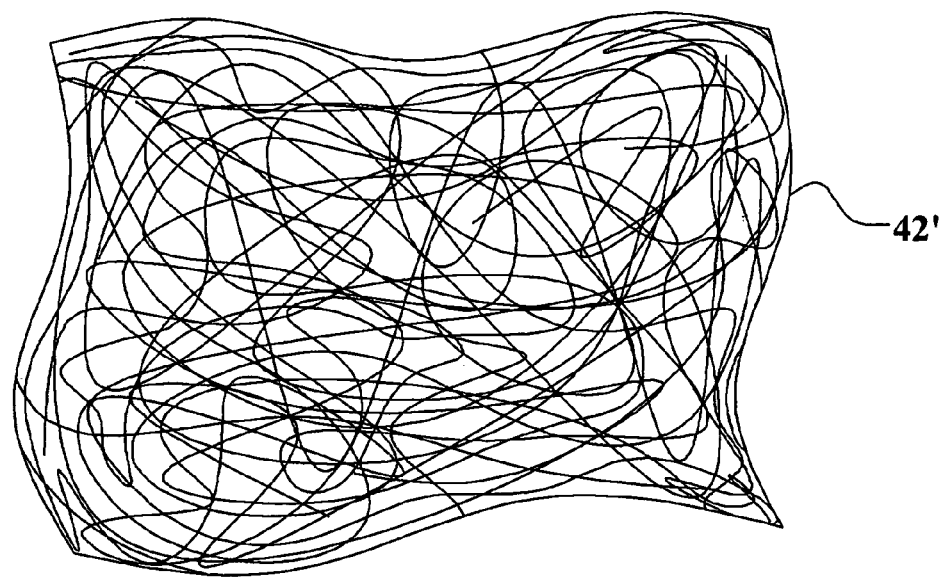
FIG. 5b
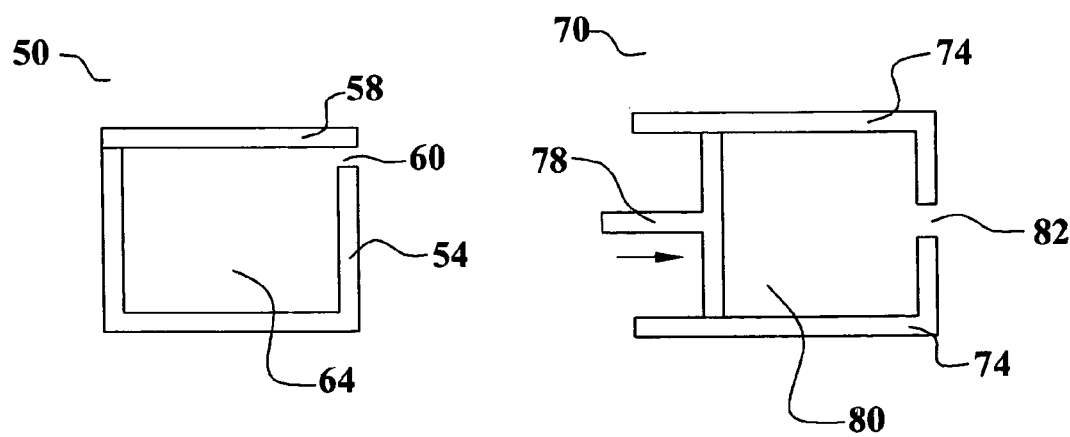
FIG. 6a  FIG. 6b

METHODS OF MAKING ELECTRICAL MOTOR COMPONENTS FROM CONDUCTIVE LOADED RESIN-BASED MATERIALS

RELATED PATENT APPLICATIONS

This patent application claims priority to the U.S. Provisional Patent Application 60/570,632, filed on May 13, 2004, which is herein incorporated by reference in its entirety.

This patent application is a Continuation-in-Part of U.S. patent application Ser. No. 10/877,092, filed on Jun. 25, 2004, now abandoned, which is a Continuation of U.S. patent application Ser. No. 10/309,429, filed on Dec. 4, 2002, now issued as U.S. Pat. No. 6,870,516, also incorporated by reference in its entirety, which is a Continuation-in-Part application of U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001, all of which are incorporated by reference in their entirety.

BACKGROUND OF THE INVENTION (1) Field of the Invention

This invention relates to electric motors and, more particularly, to electric motor components molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

Electric motors are used in a wide variety of products. Typical electric motors, such as those used in household applications, are a combination of metal and plastic components. Typically, the armatures and windings of the rotor, the commutator, and the can or case are formed of metal components. Other components, such as the end bell or the axle may comprise plastic, or resin-based, materials. The field magnets typically comprise ferrite materials such as certain metal oxides. The metal and magnetic components generate significant manufacturing cost and complexity and add substantial weight to the motor. An import object of the present invention is to replace several metal and/or magnetic components of prior art electric motor devices with components formed of a unique conductive loaded resin-based material of the present invention.

Several prior art inventions relate to electric motor components. U.S. patent application Publication US 2002/0148100 A1 to Du teaches an electric motor where a thermally conductive plastic material is injection molded over the armature of the motor to substantially encase the magnet wires. The thermally conductive plastic improves the thermal dissipation of the motor assembly to allow larger gauge magnet wires to be used and, additionally, allows a cooling fan to be molded simultaneously from the plastic material. U.S. Pat. No. 4,572,979 to Haar et al teaches a windshield wiper motor and gear mechanism having a one-piece plastic housing. U.S. Pat. No. 4,189,702 to Maloy teaches a rotating disk sonar device. Annular slip rings are electrically contacted by brushes. The slip rings may comprise a conductive plastic. U.S. Pat. No. 4,303,844 to Suzuki teaches a small DC motor having a magnetic plate disposed on an upper surface of the rotor. The magnetic plate comprises a conductive plastic.

SUMMARY OF THE INVENTION

A principal object of the present invention is to provide improved electric motor components.

A further object of the present invention is to provide a method to form improved components of an electric motor device.

A further object of the present invention is to provide a light weight armature for an electric motor.

A further object of the present invention is to provide an electromagnetic energy absorbing housing for an electric motor.

A further object of the present invention is to provide highly conductive brushes for an electric motor.

A further object of the present invention is to provide a highly conductive commutator for an electric motor.

A further object of the present invention is to provide light weight magnets for an electric motor.

A yet further object of the present invention is to provide electric motor components molded of conductive loaded resin-based material where the electrical characteristics can be altered or the visual characteristics can be altered by forming a metal layer over the conductive loaded resin-based material.

In accordance with the objects of this invention, an electric motor device is achieved. The device comprises a case having a power terminal. A rotor is mounted in free rotation in the case. A commutator is attached to the rotor. A conductive brush is connected to the power terminal and touching the commutator. The brush comprises a conductive loaded, resin-based material comprising conductive materials in a base resin host.

Also in accordance with the objects of this invention, an electric motor device is achieved. The device comprises a case having a power terminal. The case comprises a conductive loaded, resin-based material comprising conductive materials in a base resin host. A rotor is mounted in free rotation in the case. A commutator is attached to the rotor. A conductive brush is connected to the power terminal and touching the commutator.

Also in accordance with the objects of this invention, an electric motor device is achieved. The device comprises a case having a power terminal. The case comprises a conductive loaded, resin-based material comprising micron conductive fiber in a base resin host. A rotor is mounted in free rotation in the case. A commutator is attached to the rotor. A conductive brush is connected to the power terminal and touching the commutator.

Also in accordance with the objects of this invention, a method to form an electric motor component device is achieved. The method comprises providing a conductive loaded, resin-based material comprising conductive materials in a resin-based host. The conductive loaded, resin-based material is molded into an electric motor component.

Also in accordance with the objects of this invention, a method to form an electric motor device is achieved. The method comprises providing a conductive loaded, resin-based material comprising conductive materials in a resin-based host. The conductive loaded, resin-based material is molded into an electric motor device. The device comprises a case having power terminals. A rotor is mounted in free rotation in the case. A commutator is attached to the rotor. A conductive brush is connected to the power terminal and touching the commutator. The brush comprises the conductive loaded, resin-based material.

Also in accordance with the objects of this invention, a method to form a conductive fastening device is achieved. The method comprises providing a conductive loaded, resin-based material comprising micron conductive fiber in a resin-based host. The percent by weight of the micron conductive fiber is between 20% and 50% of the total weight of the conductive loaded resin-based material. The conductive loaded, resin-based material is molded into an electric motor device. The device comprises a case having power terminals. The case comprises the conductive loaded resin-based material. A rotor is mounted in free rotation in the case. A commutator is attached to the rotor. A conductive brush is connected to the power terminal and touching the commutator.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold electric motor components of a conductive loaded resin-based material.

DESCRIPTION OF THE PREFERRED EMBODIMENTS

Figure 1:
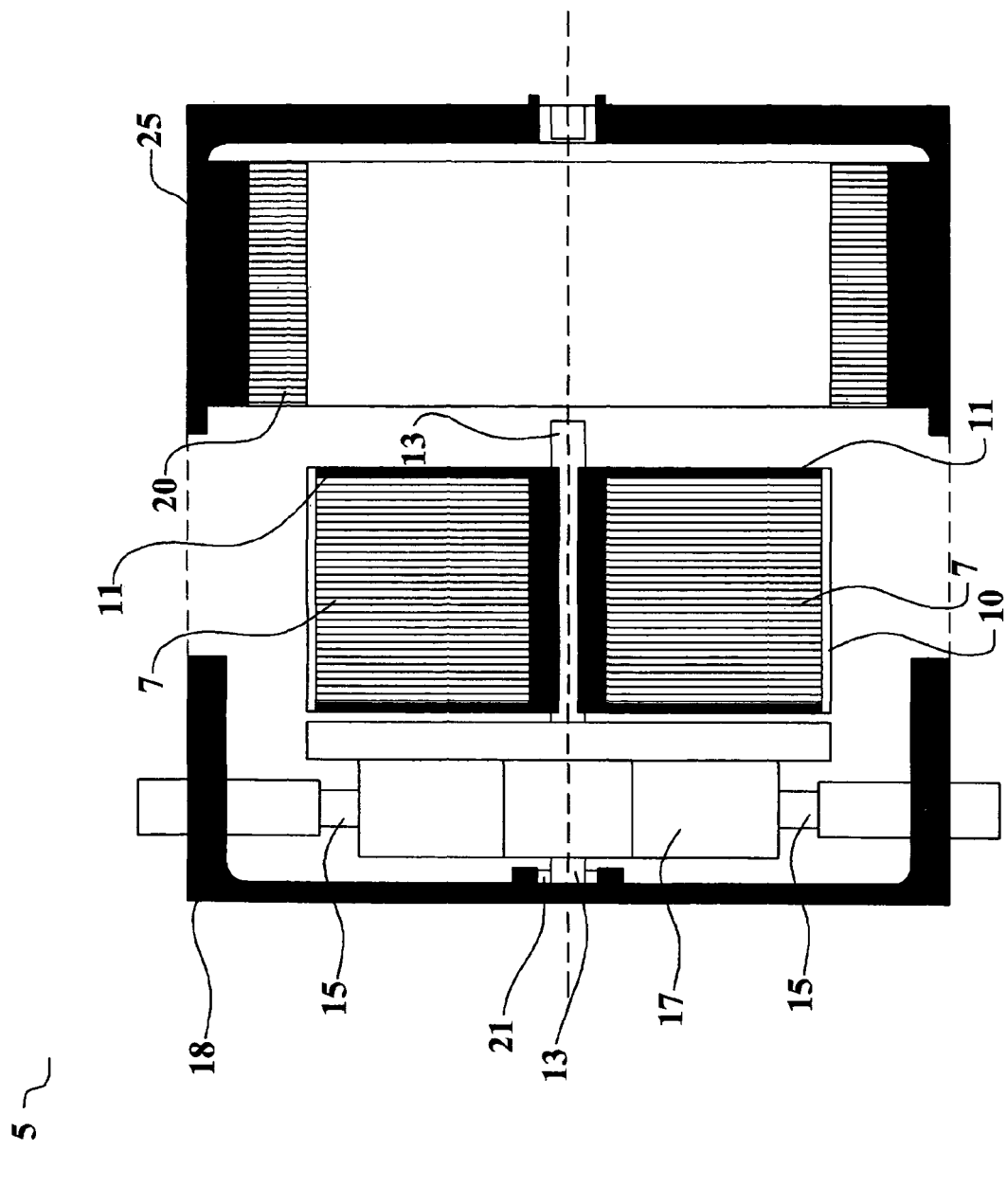
FIG. 1 illustrates a preferred embodiment of the present invention showing an electrical motor incorporating components comprising a conductive loaded resin-based material.

This invention relates to electric motor components molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of electric motor components fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the electric motor components are substantially homogenized together using molding techniques and or methods such as injection molding, over-molding, insert molding, thermo-set, protrusion, extrusion, calendaring or the like. Characteristics related to 2D, 3D, 4D, and 5D designs, molding and electrical characteristics include the physical and electrical advantages that can be achieved during the molding process of the actual parts and the polymer physics associated within the conductive networks within the molded part(s) or formed material(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

Resistivity is a material property that depends on the atomic bonding and on the microstructure of the material. The atomic microstructure material properties within the conductive loaded resin-based material are altered when molded into a structure. A substantially homogenized conductive microstructure of delocalized valance electrons is created. This microstructure provides sufficient charge carriers within the molded matrix structure. As a result, a low density, low resistivity, lightweight, durable, resin based polymer microstructure material is achieved. This material exhibits conductivity comparable to that of highly conductive metals such as silver, copper or aluminum, while maintaining the superior structural characteristics found in many plastics and rubbers or other structural resin based materials.

The use of conductive loaded resin-based materials in the fabrication of electric motor components significantly lowers the cost of materials and the design and manufacturing processes used to hold ease of close tolerances, by forming these materials into desired shapes and sizes. The electric motor components can be manufactured into infinite shapes and sizes using conventional forming methods such as injection molding, over-molding, or extrusion, or calendaring, or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. The micron conductive powders can be of carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The addition of conductive powder to the micron conductive fiber loading increases the surface conductivity of the molded part, particularly in areas where a skinning effect occurs during molding.

The micron conductive fibers may be metal fiber or metal plated fiber. Further, the metal plated fiber may be formed by plating metal onto a metal fiber or by plating metal onto a non-metal fiber. Exemplary metal fibers include, but are not limited to, stainless steel fiber, copper fiber, nickel fiber, silver fiber, aluminum fiber, or the like, or combinations thereof. Exemplary metal plating materials include, but are not limited to, copper, nickel, cobalt, silver, gold, palladium, platinum, ruthenium, and rhodium, and alloys of thereof. Any platable fiber may be used as the core for a non-metal fiber. Exemplary non-metal fibers include, but are not limited to, carbon, graphite, polyester, basalt, man-made and naturally-occurring materials, and the like. In addition, superconductor metals, such as titanium, nickel, niobium, and zirconium, and alloys of titanium, nickel, niobium, and zirconium may also be used as micron conductive fibers and/or as metal plating onto fibers in the present invention.

The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion, or calendaring to create desired shapes and sizes. The molded conductive loaded resin-based materials can also be stamped, cut or milled as desired to form create the desired shape form factor(s) of the electric motor components. The doping composition and directionality associated with the micron conductors within the loaded base resins can affect the electrical and structural characteristics of the electric motor components and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive-flexible cloth-like material. Such a cloth-like material could also be used in forming electric motor components that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in electric motor component applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, electric motor components manufactured from the molded conductor loaded resin-based material can provide added thermal dissipation capabilities to the application. For example, heat can be dissipated from electrical devices physically and/or electrically connected to electric motor components of the present invention.

As a significant advantage of the present invention, electric motor components constructed of the conductive loaded resin-based material can be easily interfaced to an electrical circuit or grounded. In one embodiment, a wire can be attached to a conductive loaded resin-based electric motor component via a screw that is fastened to the component. For example, a simple sheet-metal type, self tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the electric motor components and a grounding wire.

Where a metal layer is formed over the surface of the conductive loaded resin-based material, any of several techniques may be used to form this metal layer. This metal layer may be used for visual enhancement of the molded conductive loaded resin-based material article or to otherwise alter performance properties. Well-known techniques, such as electroless metal plating, electro metal plating, metal vapor deposition, metallic painting, or the like, may be applied to the formation of this metal layer. If metal plating is used, then the resin-based structural material of the conductive loaded, resin-based material is one that can be metal plated. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. Electroless plating is typically a multiple-stage chemical process where, for example, a thin copper layer is first deposited to form a conductive layer. This conductive layer is then used as an electrode for the subsequent plating of a thicker metal layer.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

A ferromagnetic conductive loaded resin-based material may be formed of the present invention to create a magnetic or magnetizable form of the material. Ferromagnetic micron conductive fibers and/or ferromagnetic conductive powders are mixed with the base resin. Ferrite materials and/or rare earth magnetic materials are added as a conductive loading to the base resin. With the substantially homogeneous mixing of the ferromagnetic micron conductive fibers and/or micron conductive powders, the ferromagnetic conductive loaded resin-based material is able to produce an excellent low cost, low weight magnetize-able item. The magnets and magnetic devices of the present invention can be magnetized during or after the molding process. The magnetic strength of the magnets and magnetic devices can be varied by adjusting the amount of ferromagnetic micron conductive fibers and/or ferromagnetic micron conductive powders that are incorporated with the base resin. By increasing the amount of the ferromagnetic doping, the strength of the magnet or magnetic devices is increased. The substantially homogenous mixing of the conductive fiber network allows for a substantial amount of fiber to be added to the base resin without causing the structural integrity of the item to decline. The ferromagnetic conductive loaded resin-based magnets display the excellent physical properties of the base resin, including flexibility, moldability, strength, and resistance to environmental corrosion, along with excellent magnetic ability. In addition, the unique ferromagnetic conductive loaded resin-based material facilitates formation of items that exhibit excellent thermal and electrical conductivity as well as magnetism.

A high aspect ratio magnet is easily achieved through the use of ferromagnetic conductive micron fiber or through the combination of ferromagnetic micron powder with conductive micron fiber. The use of micron conductive fiber allows for molding articles with a high aspect ratio of conductive fiber to cross sectional area. If a ferromagnetic micron fiber is used, then this high aspect ratio translates into a high quality magnetic article. Alternatively, if a ferromagnetic micron powder is combined with micron conductive fiber, then the magnetic effect of the powder is effectively spread throughout the molded article via the network of conductive fiber such that an effective high aspect ratio molded magnetic article is achieved. The ferromagnetic conductive loaded resin-based material may be magnetized, after molding, by exposing the molded article to a strong magnetic field. Alternatively, a strong magnetic field may be used to magnetize the ferromagnetic conductive loaded resin-based material during the molding process.

The ferromagnetic conductive loading is in the form of fiber, powder, or a combination of fiber and powder. The micron conductive powder may be metal fiber or metal plated fiber. If metal plated fiber is used, then the core fiber is a platable material and may be metal or non-metal. Exemplary ferromagnetic conductive fiber materials include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive fiber materials. Exemplary ferromagnetic micron powder leached onto the conductive fibers include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive powder materials. A ferromagnetic conductive loading may be combined with a non-ferromagnetic conductive loading to form a conductive loaded resin-based material that combines excellent conductive qualities with magnetic capabilities.

Referring now to FIG. 1, a preferred embodiment of the present invention is illustrated. An electric motor 5 is shown in exploded view. Several important features of the present invention are shown and discussed below. The electric motor 5 comprises components formed of the conductive loaded resin-based material of the present invention. The electric motor comprises a rotor assembly 10 that, when assembled, is held inside of a magnetic field established by magnets 20 mounted in the motor housing 25, or can. More particularly, the rotor assembly 10 comprises several armatures 7. Each armature 7 comprises a plurality of parallel plates. Each parallel plate is formed of a material capable of sustaining a magnetic field. Each armature 7 has a winding of wire 11. When the winding of wire 11 is energized by an electrical current, a magnetic field is established through the armature 7. In the preferred embodiment, three armatures are placed around the axle 13 of the rotor 10 at equal angles on the axle. During motor operation, the rotor 10 rotates causing the axle 13 to rotate.

Each armature 7 is electrically connected to a commutator 17. The commutator 17 is a round cylinder that rotates with the axle 13. Conductive brushes 15 are mounted into the end cap 18 of the motor housing such that each brush 15 contacts the commutator 17. During motor operation, the rotating rotor 10 causes the commutator 17 to rotate past the brushes 15. Electrical current is thereby connected from a power source, not shown, through the brushes 15 and into the commutator ring 17, and then into the windings 11 of the armatures 7. The commutator 17 has a conductive outer surface with a segmented contact pattern. This pattern is formed as a series of electrically separate sections that are each connected to one of the armature windings 11. As the rotor 10 and commutator 17 spin, electrical connections between the brushes 15 and their respective terminals with the different commutator 17 sections are made and broken several times with each rotation. The commutator 17 switches the polarity of the windings 11 at the appropriate time and supplies power to the windings 11. As a result, the direction of current flow in each armature winding 11 reverses at the correct time. This capability allows the motor 5 to convert electrical current flow into a magnetic energy and then to convert this magnetic energy into rotational energy.

The rotor 10 is essentially a series of electromagnets distributed radially about the axle 13. Each winding coil 11 is wound onto an armature stack 7 such that the armature stack forms an electromagnet with a magnetic field radiating out from the axle 13. The armature stacks 7 are laminated pieces of magnetic material that enhance the magnetic field produced by the windings 11. The use of laminated magnetic material in the armature stacks 7 prevents magnetic eddy currents from forming and reducing the efficiency.

The rotor assembly 10 is fixably mounted on the axle 13. The axle 13 is seated into the end bell 18 at one end and into the motor can 25 at the other end. A bushing 21, or bearing, is used to reduce friction between the axle and end bell 18. When assembled, the motor can 25 surrounds the rotor 10. Magnets 20 are mounted onto the inner surface of the motor can 25. As a result, the rotor assembly 10 is held within a fixed magnetic field generated by the motor can magnets 20.

In the preferred embodiment of the present invention, any component of the motor assembly 5 comprises the conductive loaded resin-based material of the present invention. Alternatively, several components comprise the conductive loaded resin-based material. The conductive loaded resin-based material provides a unique combination of properties, including electrical conductivity, thermal conductivity, magnetic capability, electromagnetic energy absorption, low weight, and ease of manufacture, that are very useful to this application.

In one embodiment, the conductive brushes 15 are formed of the conductive loaded resin-based material. The brushes 15 make a sliding electrical contact with the commutator 17. The brushes 15 are pressed against the commutator 17 with brush springs and are designed to have a low friction to reduce commutator 17 abrasion. The conductive loaded resin-based materials of the brushes 15 of this invention are chosen based on their hardness, specific resistance, transverse strength, current carrying capacity, contact drop, coefficient of friction, and abrasiveness. Hardness is a measure used mainly as a quality control tool and serves to determine the consistency of quality of brush material. Specific resistance measures the resistance offered by the brush material to the flow of current through the brushes 15. Transverse strength refers to the transverse breaking strength of the brush material. Current carrying capacity is expressed in amperes and is the load per unit cross-section area a brush 15 can carry safely under operating conditions. Contact drop is the voltage drop between the contact face of the brushes 15 and the commutator 17. Coefficient of friction is the resistance offered by the brushes 15 and commutator 17 while in contact with each other. Abrasiveness is the ability of a brush 15 to remove film from the commutator 17 and to keep the commutator in a polished condition.

The conductive loaded resin-based material of the present invention provides unique features in the conductive brushes 15. The conductive loading network provides a highly conductive path for current flow resulting in a low voltage drop brush. The type of conductive loading and doping level can be easily changed to form the desired electrical characteristics. A large number of resin-based materials are available such that an optimal combination of transverse strength, hardness, flexibility, coefficient of friction, and flexibility can be selected.

The brushes 15 are easily formed by any of the known methods of forming resin-based materials. In one embodiment, the conductive loaded resin-based material is molded via injection molding into a brush 15. In another embodiment, the conductive loaded resin-based material is extruded into a brush shape and then cut to size. In other embodiments, sub-assemblies of a brush 15 are formed by molding processes and then assembled to form the brush.

In another preferred embodiment of the present invention, the commutator 17 comprises the conductive loaded resin-based material. As in the case of the brushes 15, the conductive loaded resin-based materials of the commutator 17 is chosen based on the hardness, specific resistance, transverse strength, current carrying capacity, contact drop, coefficient of friction, and abrasiveness of the material. The conductive loaded resin-based material of the present invention provides unique features in the conductive commutator 17. The conductive loading network provides a highly conductive path for current flow resulting in a low voltage drop commutator 17. The type of conductive loading and doping level can be easily changed to form the desired electrical characteristics. A large number of resin-based materials are available such that an optimal combination of transverse strength, hardness, flexibility, coefficient of friction, and flexibility can be selected.

The commutator 17 is easily formed by any of the known methods of forming resin-based materials. In one embodiment, the conductive loaded resin-based material is molded via injection molding into a commutator 17. In another embodiment, the conductive loaded resin-based material is extruded into a commutator 17 shape and then cut to size. In other embodiments, sub-assemblies of the commutator 17 are formed by molding processes and then assembled to form a commutator.

In another preferred embodiment of the present invention, the end bell 18 is formed of the conductive loaded resin-based material of the present invention. The end-bell 18 supports one end of the axle 13 on a bearing 21, and holds the motor brushes 15, and the power wires. The end-bell 18 has brush hoods on it which serve as guides for the brushes 15 and brush spring posts which hold the brush springs in place. The conductive loaded resin-based material provides a low weight and easy to manufacture material for the end bell 18. The conductive loaded resin-based materials for the end-bell 18 are chosen to provide necessary mechanical support for the rotation of the motor 5. In addition, the excellent electromagnetic energy absorbing capabilities of the conductive loaded resin-based materials allow the end bell 18 to serve the additional function of absorbing electromagnetic energy radiated from the rotor 10 to thereby reduce electromagnetic interference (EMI) from the motor 5.

In another preferred embodiment of the present invention, the motor can 25, or housing, is formed of the conductive loaded resin-based material of the present invention. The can 25 houses the magnets 20 and supports one end of the axle 13 in a bushing or bearing. The can 25 is affixed to the end bell 18 to complete the casing of the motor 5. As with the end bell 18, the conductive loaded resin-based materials for the can 25 are chosen to provide a low weight, easy to manufacture, mechanical support for the rotation of the motor. Further, the conductive loaded resin-based materials for the can 25 absorb electromagnetic energy radiated from the rotor 10 to thereby reduce electromagnetic interference (EMI) from the motor 5.

In another preferred embodiment of the present invention, the armatures 7 are formed of the conductive loaded resin-based material of the present invention. As described above, conductive loadings vary with respect to their ability to enhance a magnetic field and/or to be magnetized. An armature formed with a ferromagnetic conductive loading will significantly focus and enhance the magnetic field of the produced by the coiling winding 11. In one embodiment, only ferromagnetic loading is added to the base resin to form the armature material. In another embodiment, a conductive, non-ferromagnetic loading, is also added to the ferromagnetic loading to provide a more electrically or thermally conductive armature. In yet another embodiment, only a conductive, non-ferromagnetic, loading is used in the conductive loaded resin-based material. By using any formulation of the conductive loaded resin-based material of the present invention, low weight, easy to manufacture, armatures are produced.

In another preferred embodiment of the present invention, the field magnets 20 of the motor 5 are formed of the conductive loaded resin-based material. The field magnets 20 are what attract and oppose the poles of the armatures 7 in order to produce differential movement between them. Strong field magnets 20 increase the motor speed and torque. In one embodiment, the field magnets 20 are permanent magnets. In this case, a ferromagnetic loading is used in the conductive loaded resin-based material to create a magnetizable molding. This molding is preferably magnetized during the molding operation. In another embodiment, the field magnets 20 are electromagnets, or stators. Each field electromagnet 20 has an armature stack and a wire winding similar to those in the rotor 10. In this case, the armature stack of the electromagnet 20 is formed of the conductive loaded resin-based material as described above.

Figure 2:
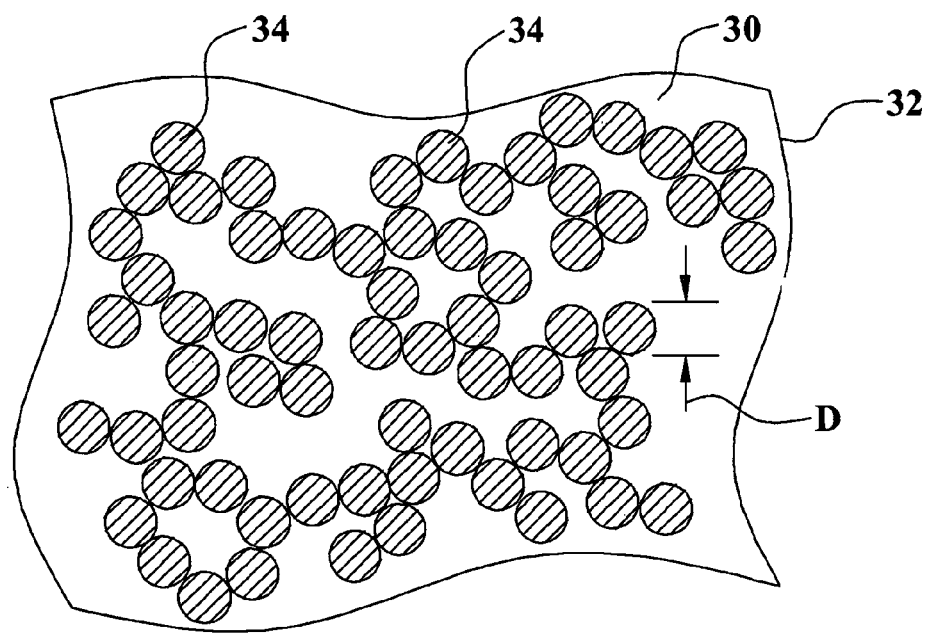
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
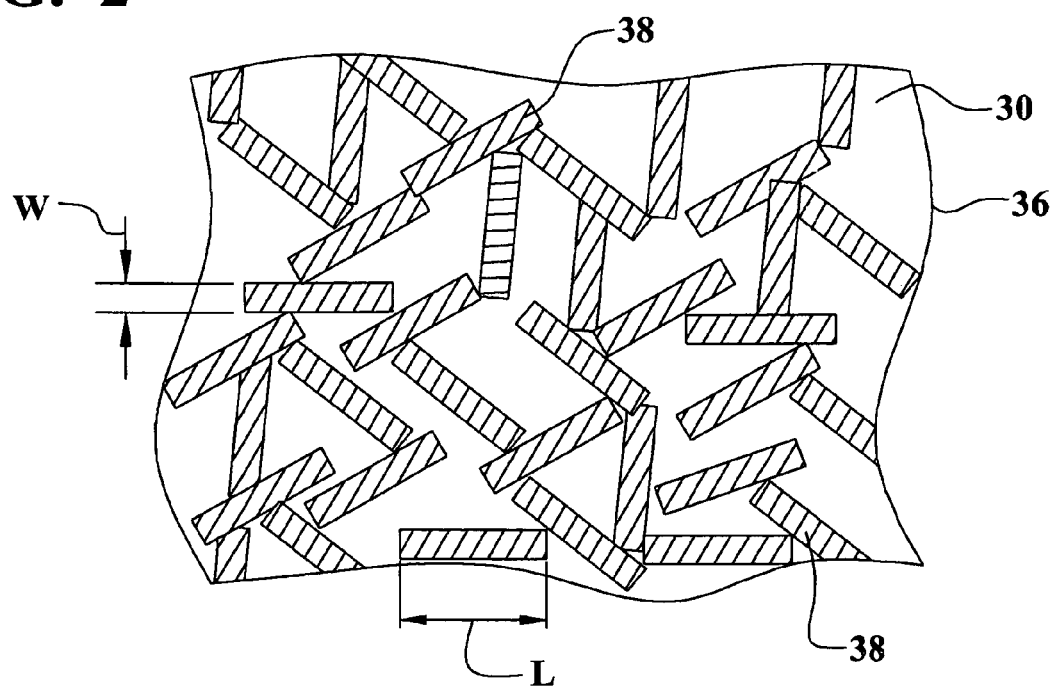
FIG. 3 illustrates a second preferred embodiment of a conductive loaded resin-based material wherein the conductive materials comprise micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The micron conductive fibers 38 may be metal fiber or metal plated fiber. Further, the metal plated fiber may be formed by plating metal onto a metal fiber or by plating metal onto a non-metal fiber. Exemplary metal fibers include, but are not limited to, stainless steel fiber, copper fiber, nickel fiber, silver fiber, aluminum fiber, or the like, or combinations thereof. Exemplary metal plating materials include, but are not limited to, copper, nickel, cobalt, silver, gold, palladium, platinum, ruthenium, and rhodium, and alloys of thereof. Any platable fiber may be used as the core for a non-metal fiber. Exemplary non-metal fibers include, but are not limited to, carbon, graphite, polyester, basalt, man-made and naturally-occurring materials, and the like. In addition, superconductor metals, such as titanium, nickel, niobium, and zirconium, and alloys of titanium, nickel, niobium, and zirconium may also be used as micron conductive fibers and/or as metal plating onto fibers in the present invention.

Figure 4:
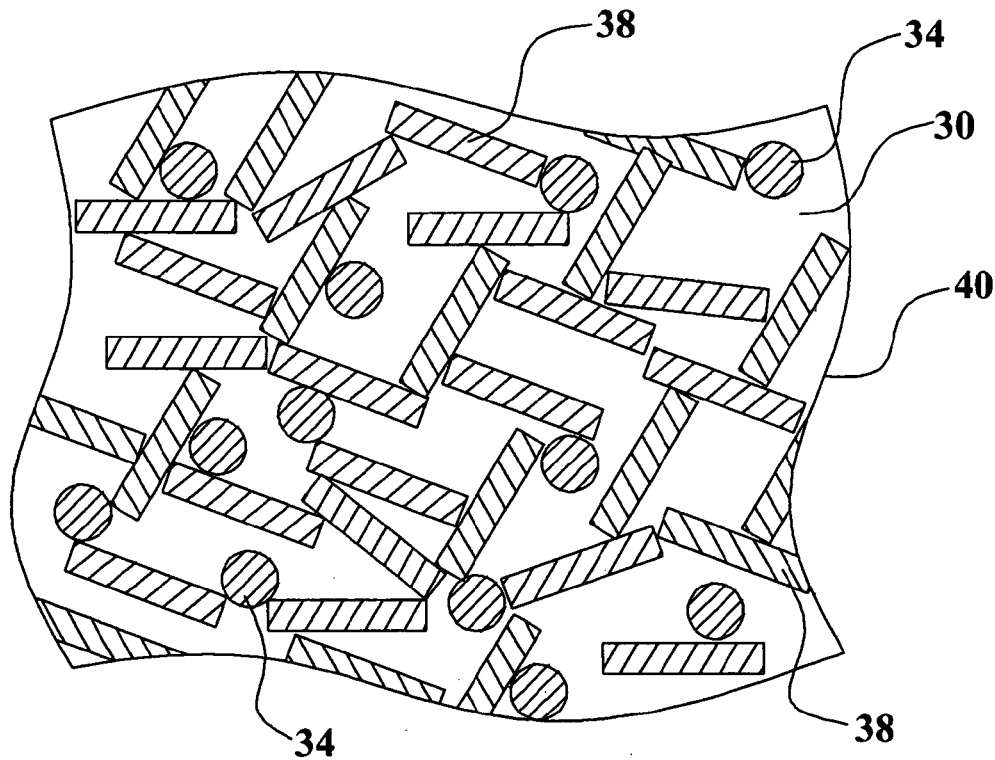
FIG. 4 illustrates a third preferred embodiment of a conductive loaded resin-based material wherein the conductive materials comprise both conductive powder and micron conductive fibers.

These conductor particles and/or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6-12 micron in diameter and lengths of 4-6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
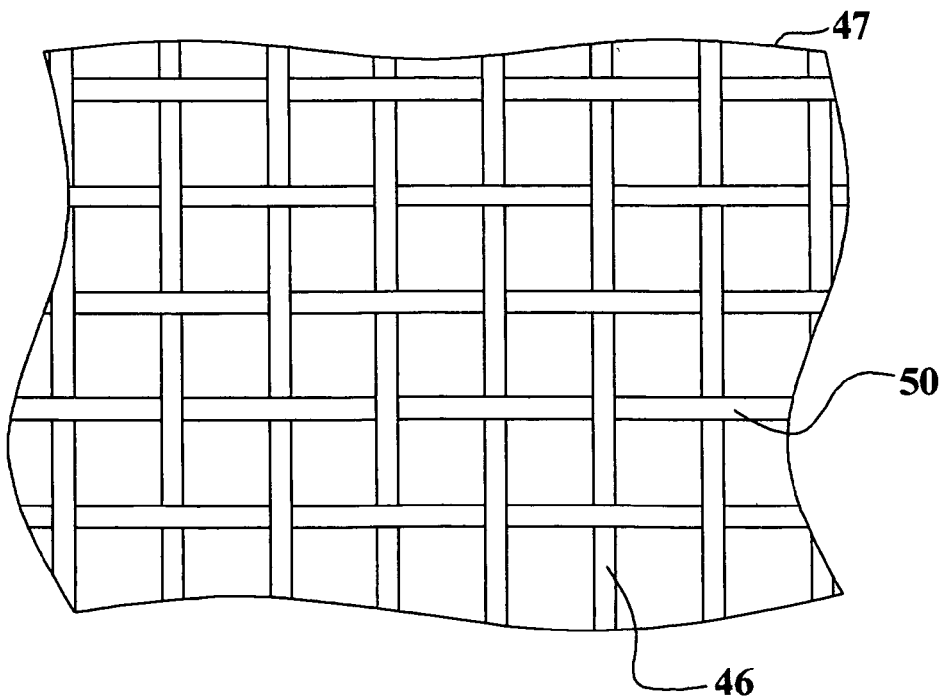

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Electric motor components formed from conductive loaded resin-based materials can be formed or molded in a number of different ways including injection molding, extrusion, calendaring or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the electric motor components are removed.

FIG. 6b shows a simplified schematic diagram of an extruder 70 for forming electric motor components using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. Improved electric motor components have been achieved. Methods to form improved components of an electric motor device have been achieved. A light weight armature for an electric motor has been achieved. An electromagnetic energy absorbing housing for an electric motor has been achieved. Highly conductive brushes and commutators for electric motors have been achieved. Effective and light weight magnets for an electric motor have been achieved. The electrical characteristics of the motor components can be altered or the visual characteristics can be altered by forming a metal layer over the conductive loaded resin-based material.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form an electric motor component device, said method comprising:
    providing a conductive loaded, resin-based material comprising micron conductive fiber in a resin-based host, wherein said micron conductive fiber has a diameter of between 3 μm and 11 μm and a length of between 5 mm and 10 mm;
    injection molding said conductive loaded, resin-based material into a shape operable as an armature of a rotor of an electric motor; and
    forming a metal layer overlying a surface of the armature.

2. The method according to claim 1 wherein the percent by weight of said micron conductive fiber is between about 20% and about 40% of the total weight of said conductive loaded resin based material.

3. The method according to claim 2 wherein said conductive loaded, resin-based material further comprises conductive powder.

4. The method according to claim 1 wherein said step of injection molding comprises:
    injecting said conductive loaded, resin-based material into a mold to form said shape;
    curing said conductive loaded, resin-based material; and
    removing said shape from said mold.

5. The method according to claim 1 further comprising the steps of:
    injection molding said conductive loaded, resin-based material into a shape operable as a case of an electric motor; and
    forming a second metal layer overlying a surface of the case.

6. The method according to claim 1 further comprising the steps of:
    injection molding said conductive loaded, resin-based material into a shape operable as a commutator of an electric motor; and
    forming a second metal layer overlying a surface of the commutator.

7. The method according to claim 6 wherein the first and second metal layers are formed simultaneously via depositing metal by way of vacuum metallization.

8. The method according to claim 1 wherein said armature is magnetic and wherein said conductive loading is a ferromagnetic material.

9. A method to form an electric motor device, said method comprising:
    providing a conductive loaded, resin-based material comprising micron conductive fiber in a resin-based host, wherein said micron conductive fiber has a diameter of between 3 μm and 11 μm and a length of between 5 mm and 10 mm;
    injection molding said conductive loaded, resin-based material into a shape operable as a conductive brush;
    forming a metal layer overlying a surface of the conductive brush; and
    assembling an electric motor device comprising:
        a case having power terminals;
        a rotor mounted in free rotation in said case;
        a commutator attached to said rotor; and
        the conductive brush connected to said power terminal and touching said commutator.

10. The method according to claim 9 wherein said micron conductive fiber comprises stainless steel micron fiber, copper micron fiber, silver micron fiber or combinations thereof.

11. The method according to claim 9 wherein said conductive loaded, resin-based material further comprises conductive powder.

12. The method according to claim 11 wherein said conductive powder is nickel, copper, or silver.

13. The method according to claim 11 wherein said conductive powder is a nonmetallic material with a metal plating.

14. The method according to claim 9 further comprising the steps of:
- injection molding said conductive loaded, resin-based material into a shape operable as a case of an electric motor; and
- forming a second metal layer overlying a surface of the case.

15. A method to form a conductive motor device, said method comprising:
- providing a conductive loaded, resin-based material comprising micron conductive fiber in a resin-based host wherein said micron conductive fiber is a non-metallic material with a metal plating, and wherein said micron conductive fiber has a diameter of between 3 µm and 11 µm and a length of between 5 mm and 10 mm; and
- injection molding said conductive loaded, resin-based material into a shape operable as a case; for an electric motor device comprising:
- injection molding said conductive loaded, resin-based material into a shape operable as a conductive brush;
- forming a first metal layer over a surface of the case;
- forming a second metal layer over a surface of the conductive brush; and
- assembling an electric motor device comprising:
    - the case having power terminals wherein said case comprises said conductive loaded resin-based material;
    - a rotor mounted in free rotation in said case;
    - a commutator attached to said rotor; and
    - the conductive brush connected to said power terminal and touching said commutator.

16. The method according to claim 15 wherein said conductive loaded resin-based material further comprises conductive powder.

17. The method according to claim 15 wherein the first and second metal layers are formed simultaneously by way of one of electro less metal plating and electro metal plating.

18. The method according to claim 15 wherein the step of injection molding said conductive loaded, resin-based material into a shape operable as a case comprises overmolding the case onto the power terminals.

19. The method according to claim 15 wherein the micron conductive fiber comprises a ferromagnetic material.

20. The method according to claim 1 wherein the step of forming the metal layer comprises depositing metal by way of vacuum metallization.

21. The method according to claim 1 wherein the step of forming the metal layer comprises one of electro less metal plating and electro metal plating.

22. The method of claim 1 wherein the resin-based host comprises a flame resistant resin.

23. The method of claim 9 wherein the resin-based host comprises a flame resistant resin.

24. The method of claim 15 wherein the first and second metal layers are formed simultaneously via depositing metal by way of vacuum metallization.

* * * * *